United States Patent
Tolpygo et al.

(10) Patent No.: US 10,107,137 B2
(45) Date of Patent: Oct. 23, 2018

(54) TURBINE ENGINE, ENGINE STRUCTURE, AND METHOD OF FORMING AN ENGINE STRUCTURE WITH THERMAL BARRIER COATING PROTECTION

(71) Applicant: HONEYWELL INTERNATIONAL INC., Morristown, NJ (US)

(72) Inventors: Vladimir K. Tolpygo, Scottsdale, AZ (US); Wil Baker, Phoenix, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 689 days.

(21) Appl. No.: 14/023,084

(22) Filed: Sep. 10, 2013

(65) Prior Publication Data
US 2015/0068188 A1 Mar. 12, 2015

(51) Int. Cl.
| | |
|---|---|
| F01D 25/00 | (2006.01) |
| C23C 14/08 | (2006.01) |
| C23C 14/58 | (2006.01) |
| C23C 28/04 | (2006.01) |
| F01D 5/28 | (2006.01) |

(52) U.S. Cl.
CPC .......... *F01D 25/005* (2013.01); *C23C 14/08* (2013.01); *C23C 14/083* (2013.01); *C23C 14/584* (2013.01); *C23C 28/042* (2013.01); *C23C 28/044* (2013.01); *F01D 5/288* (2013.01); *Y10T 428/12479* (2015.01); *Y10T 428/24997* (2015.04)

(58) Field of Classification Search
CPC ... C23C 14/083; C23C 14/584; C23C 28/042; C23C 28/044; C23C 14/08; F01D 25/005; F01D 5/288; Y10T 428/24997; Y10T 428/12479
See application file for complete search history.

(56) References Cited

U.S. PATENT DOCUMENTS

| | | | |
|---|---|---|---|
| 5,851,678 A | 12/1998 | Hasz et al. | |
| 5,871,820 A | 2/1999 | Hasz et al. | |
| 5,914,189 A * | 6/1999 | Hasz ........................ | C23C 4/02 428/335 |

(Continued)

FOREIGN PATENT DOCUMENTS

EP 1666638 A1 6/2006

OTHER PUBLICATIONS

Suzuki et al. "Structure Control of Plasma Sprayed Zircon Coating by Substrate Preheating and Post Heat Treatment", Materials Transactions. vol. 46, 2005, No. 3, p. 669-674.*

(Continued)

*Primary Examiner* — Jonathan C Langman
(74) *Attorney, Agent, or Firm* — Lorenz & Kopf, LLP

(57) ABSTRACT

A turbine engine, an engine structure, and a method of forming an engine structure are provided herein. In an embodiment, an engine structure includes a metal substrate, a thermal barrier coating layer, and a metal silicate protective layer. The thermal barrier coating layer overlies the metal substrate, and the thermal barrier coating layer has columnar grains with gaps defined between the columnar grains. The metal silicate protective layer is formed over the thermal barrier coating layer, and the metal silicate protective layer covers the columnar grains and the gaps between the columnar grains.

16 Claims, 2 Drawing Sheets

(56) References Cited

U.S. PATENT DOCUMENTS

| | | | |
|---|---|---|---|
| 6,054,184 A * | 4/2000 | Bruce | C23C 14/081 427/248.1 |
| 6,627,323 B2 | 9/2003 | Nagaraj et al. | |
| 6,720,038 B2 | 4/2004 | Darolia et al. | |
| 6,759,151 B1 | 7/2004 | Lee | |
| 7,354,651 B2 | 4/2008 | Hazel et al. | |
| 7,374,825 B2 * | 5/2008 | Hazel | C23C 28/321 416/241 B |
| 7,455,913 B2 | 11/2008 | Freling et al. | |
| 7,780,832 B2 * | 8/2010 | Hasz | C25D 7/10 204/486 |
| 7,807,231 B2 | 10/2010 | Gorman et al. | |
| 7,862,901 B2 | 1/2011 | Darolia et al. | |
| 7,875,370 B2 | 1/2011 | Schlichting et al. | |
| 8,343,589 B2 | 1/2013 | Kirby et al. | |
| 2003/0157361 A1 | 8/2003 | Nagaraj et al. | |
| 2005/0112381 A1 * | 5/2005 | Raybould | C04B 41/52 428/446 |
| 2006/0211241 A1 | 9/2006 | Govern et al. | |
| 2007/0065672 A1 * | 3/2007 | Bhatia | C04B 41/009 428/446 |
| 2009/0017260 A1 * | 1/2009 | Kulkarni | C23C 4/18 428/161 |
| 2009/0186237 A1 | 7/2009 | Lee | |

OTHER PUBLICATIONS

Mechnich et al., "High Temperature Corrosion of EB-PVD Yttria Partially Stabilized Zirconia Thermal Barrier Coatings with an Artificial Volcanic Ash Overlay", Journal of the American Ceramic Society, vol. 94, No. 3, 2011, pp. 925-931. (Year: 2011).*

Clarke, D. R., et al.: "Thermal-barrier coatings for more efficient gas-turbine engines" Materials Research Society (MRS) Bulletin, Oct. 2012 vol. 37 No. 10, http://www.mrs.org/bulletin; pp. 891-941.

Extended European Search Report, EP 14181856.7-1362 dated Jan. 23, 2015.

European Examination Report for Application No. 14181856.7-1362 dated Mar. 16, 2017.

* cited by examiner

TURBINE ENGINE, ENGINE STRUCTURE, AND METHOD OF FORMING AN ENGINE STRUCTURE WITH THERMAL BARRIER COATING PROTECTION

TECHNICAL FIELD

The technical field generally relates to turbine engines, engine structures, and methods of forming engine structures with a thermal barrier coating disposed over a metal substrate of the engine structures. More particularly, the technical field relates to protection of the thermal barrier coating disposed over the metal substrate of the engine structures.

BACKGROUND

Aircraft gas turbine engines are often exposed to extreme conditions during operation that result in degradation or compromise of structures therein, resulting in required maintenance or replacement of various parts of the engines. To impede degradation of structures in the engines, various coatings may be formed on the structures. For example, an environmental barrier coating (EBC) may be formed on various structures to protect the structures from oxidation and corrosion due to exposure to oxygen and water vapor, as well as other airborne contaminants. A thermal barrier coating (TBC) may also be formed over the structures in the engine, independent from the EBC, to effectively insulate and minimize thermal impact on the structures in the engine due to temperature cycling.

TBCs may be formed through a physical vapor deposition (PVD) process to develop a columnar microstructure of the TBC, with gaps defined between columnar grains in the TBC. Further, TBC materials are generally chosen from oxide ceramics having low thermal conductivity, with zirconium oxide commonly employed.

The columnar microstructure of the TBCs enables the TBCs to provide effective thermal insulation to underlying structures while resisting cracking or delamination during thermal cycling. In particular, gaps between individual columnar grains in the microstructure allow the TBC to expand and contract without developing stresses that could lead to spalling. The TBCs that have the columnar microstructure may be compromised under various circumstances. For example, TBC degradation may result from ingestion of airborne particles into the engines during operation. The airborne particles, commonly referred to as calcia-mangesia-alumina-silicate (CMAS), can melt at high operating temperatures of the engines and infiltrate the gaps between the columnar grains. Upon cooling, the infiltrated CMAS solidifies and thusly increases stiffness of the coating, leading to thermo-mechanical degradation of the TBCs.

Various approaches have been investigated to minimize degradation of the TBCs due to CMAS infiltration and thermo-mechanical degradation associated therewith, although a clear-cut solution has yet to be identified. One common approach is to introduce a TBC material that reacts with CMAS to produce a stable, high melting temperature compound that would also block open gaps on the TBC surface and prevent infiltration of CMAS into the gaps; however, this approach may result in inconsistent surface properties of the TBC. In fact, adequately inhibiting thermo-mechanical degradation of the TBCs due to CMAS infiltration while maintaining the physical and mechanical properties of the TBC continues to be a challenge.

Accordingly, it is desirable to provide engine structures and methods of forming the engine structures with a TBC that has a microstructure of columnar grains with gaps defined between the columnar grains, and with the TBC protected against CMAS infiltration into the gaps without sacrificing the physical and mechanical properties of the TBC. Furthermore, other desirable features and characteristics of the present invention will become apparent from the subsequent detailed description of the invention and the appended claims, taken in conjunction with the accompanying drawings and this background of the invention.

BRIEF SUMMARY

A turbine engine, an engine structure, and a method of forming an engine structure are provided herein. In an embodiment, an engine structure includes a metal substrate, a thermal barrier coating layer, and a metal silicate protective layer. The thermal barrier coating layer overlies the metal substrate, and the thermal barrier coating layer has columnar grains with gaps defined between the columnar grains. The metal silicate protective layer is formed over the thermal barrier coating layer, and the metal silicate protective layer covers the columnar grains and the gaps between the columnar grains.

In another embodiment, a turbine engine includes an engine structure that is disposed in the turbine engine. The engine structure is exposed to elevated operating temperature and airborne particles during operation of the turbine engine. The engine structure includes a metal substrate, an yttria-stabilized zirconia (YSZ) layer, and a zirconium silicate protective layer. The YSZ layer overlies the metal substrate, and the zirconia-based layer includes columnar grains with gaps defined between the columnar grains. The zirconium silicate protective layer is formed directly over the YSZ layer, and the zirconium silicate protective layer covers the columnar grains and the gaps between the columnar grains.

In another embodiment, a method of forming an engine structure includes providing a metal substrate. A thermal barrier coating layer is formed overlying the metal substrate, and the thermal barrier coating layer includes columnar grains with gaps defined between the columnar grains. A metal silicate protective layer is formed over the thermal barrier coating layer, and the metal silicate protective layer covers the columnar grains and the gaps between the columnar grains in the thermal barrier coating layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Turbine engines, engine structures, and methods of forming engine structures are provided that include a thermal barrier coating (TBC) layer disposed thereon to insulate and minimize thermal impact on the engine structure due to temperature cycling. A metal silicate protective layer is formed over the TBC layer, with the metal silicate protective layer covering the columnar grains and the gaps between the columnar grains. The metal silicate protective layer is a top sealing layer over the TBC layer and protects the TBC layer against calcia-mangesia-alumina-silicate (CMAS) and other particulate melt infiltration into the gaps by providing a continuous coating over the TBC layer. Moreover, the metal silicate of the protective layer may have low solubility and diffusivity with constituents of the TBC layer and CMAS deposits, thereby maintaining physical and mechanical properties of the TBC layer while still providing adequate protection of the TBC layer from CMAS and other particulate melt infiltration.

Figure 1:
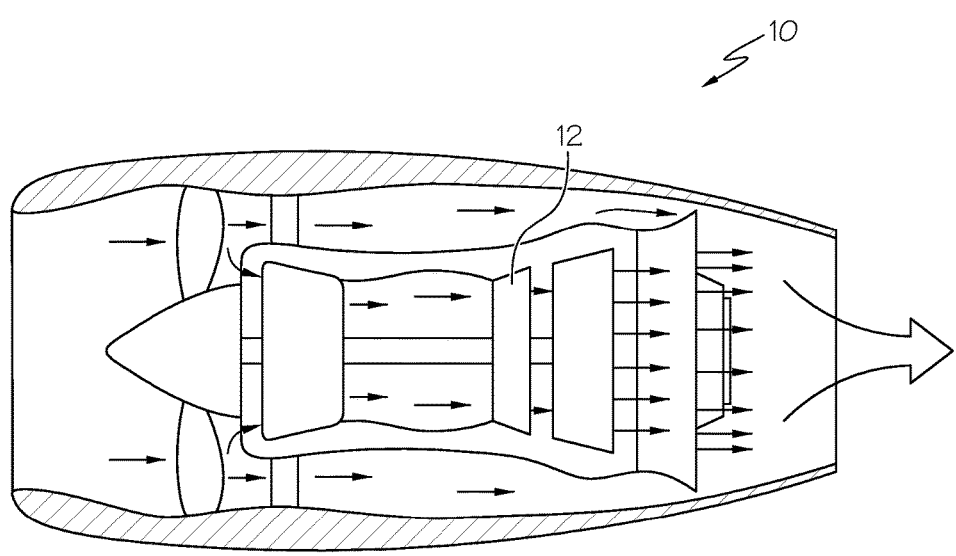
FIG. 1 is a schematic cross-sectional side view of a portion of a turbine engine including an engine structure.

As alluded to above, the TBC layer and metal silicate protective layer may be included on an engine structure that is included in a turbine engine. In embodiments, the TBC layer and metal silicate protective layer are included on an engine structure that exposed to elevated operating temperature and airborne particles during operation of the turbine engine, such as a rotating component of the turbine engine although it is to be appreciated that the TBC layer and metal silicate protective layer may also or alternatively be disposed on a non-rotating component of the turbine engine, such as a turbine nozzle. Referring to FIG. 1, an embodiment of a turbine engine 10 is shown that includes an engine structure 12 disposed in the turbine engine 10 and upon which a TBC layer and a metal silicate protective layer may be disposed. In an embodiment and as shown in FIG. 1, the engine structure 12 is a high pressure turbine component that may be exposed to elevated temperatures during operation. However, the particular engine structure upon which the TBC layer and the metal silicate protective layer may be disposed is not particularly limited and can be any structure of the turbine engine 10 that is exposed to elevated operating temperature and that is further exposed to airborne particles during operation of the turbine engine 10. "Elevated operating temperature", as referred to herein, is a temperature that is sufficient to melt CMAS or other particulate materials that are commonly ingested by turbine engines during operation. For example, "elevated temperature" may be a temperature of at least 1000° C.

Figure 2:
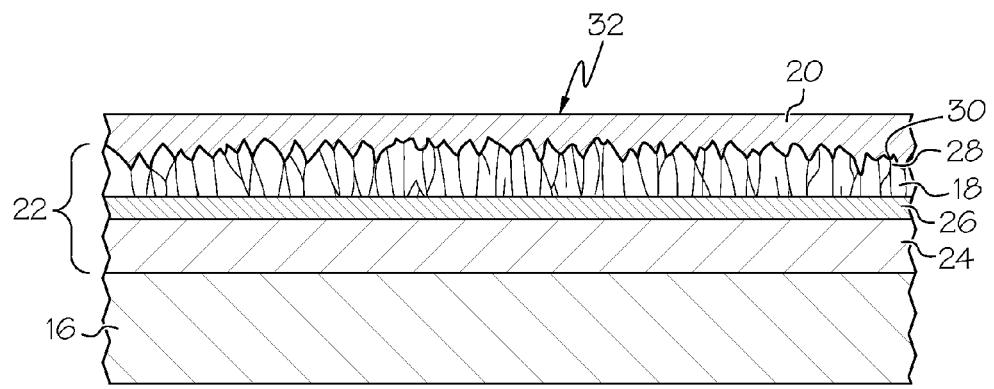
FIG. 2 is a schematic cross-sectional side view of an engine structure including a metal substrate, a thermal barrier coating including, among other layers, a thermal barrier coating layer having columnar grains, and a metal silicate protective layer formed over the thermal barrier coating layer.

Referring to FIG. 2, a cross-sectional side view of the engine structure 12 is shown that includes a metal substrate 16, a TBC layer 18 disposed on and overlying the metal substrate 16, and a metal silicate protective layer 20 formed over the TBC layer 18. As shown in FIG. 2, it is to be appreciated that the TBC layer 18 may be a layer within a thermal barrier coating 22 that includes various layers 18, 24, 26. For example and as shown in FIG. 2, the thermal barrier coating 22 may include, in addition to the TBC layer 18, a bond coat 24 and a thermally-grown oxide (TGO) layer 26. However, it is to be appreciated that in embodiments, the TBC layer 18 may be formed directly on the metal substrate 16.

The metal substrate 16, as referred to herein, is any substrate that includes at least 50 weight % of one or more elemental metals and that possess material properties that are generally characteristic of metals, such as high electrical and thermal conductivity and good malleability. In embodiments, the metal substrate 16 is a nickel, cobalt, or iron-based material, such as a high temperature alloy. For example, suitable alloys for the metal substrate 16 include, but are not limited to, superalloys such as MAR-M247, IN-100 and CMSX-4, the formulations of which are known in the art. In accordance with an exemplary method of forming the engine structure 12, the metal substrate 16 may be formed into a shape of the engine structure for the turbine engine prior to formation of the TBC 22 thereon.

Figure 3A:
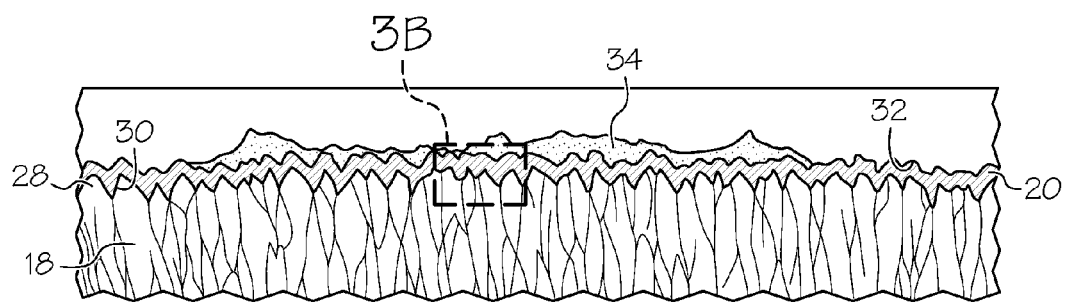
FIG. 3A is a cross-sectional electron micrograph of an engine structure including a thermal barrier coating layer and a metal silicate protective layer formed over the thermal barrier coating layer.
Figure 3B:
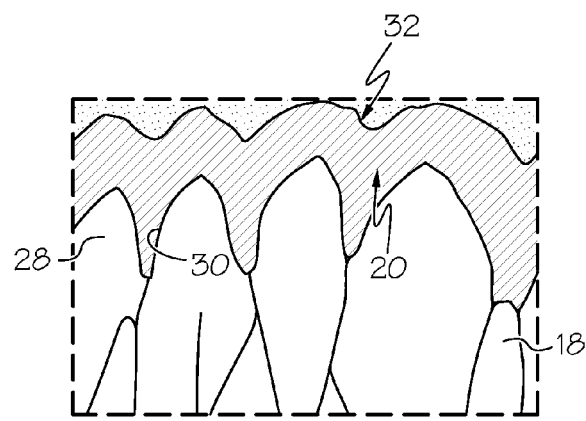
FIG. 3B is a magnified view of a portion of the cross-sectional electron micrograph of FIG. 3A.

As referred to herein and as shown in FIGS. 2 and 3, "thermal barrier coating layer" or "TBC layer" is a layer within a thermal barrier coating 22 that has columnar grains 28 with gaps 30 defined between the grains to resist cracking due to thermal cycling, with the gaps 30 between individual columnar grains 28 in the microstructure allowing the columnar grains 28 to expand and contract without developing stresses that could lead to spalling. It is to be appreciated that "columnar grains" refer to grains that have grain boundaries that are oriented substantially perpendicular to the metal substrate 16. "gaps" between the columnar grains 28, as referred to herein and as shown in FIGS. 2 and 3, refer to narrow empty spaces between adjacent columns that are produced as the columns grow during PVD. The characteristic microstructure of the TBC layer 18 may be obtained through the manner in which the TBC layer 18 is formed. For example, in an embodiment, TBC layer 18 may be formed over the metal substrate 16 by physical vapor depositing a thermal barrier coating material over the metal substrate 16 to produce the columnar grains 28 with gaps 30 defined therebetween in the TBC layer 18. Suitable materials for the TBC layer 18 include various ceramics that are known for TBC applications. In embodiments, the TBC layer 18 is an yttria-stabilized zirconia. However, it is to be appreciated that other ceramic materials such as hafnia and ceria-based materials may also be used in the TBC layer 18. Examples of suitable materials also include, but are not limited to, rare-earth zirconates or alkaline earth metal zirconates. The TBC layer 18 may have a thickness of from about 1 to about 1000 microns, such as from about 25 to about 250 microns.

The bond coat 24 in the TBC 22 may be disposed between the metal substrate 16 and the TBC layer 18 to facilitate bonding of the TBC layer 18 to the metal substrate 16. Materials for the bond coat 24 are not particularly limited and may depend upon particular chemistry of the metal substrate 16 and the TBC layer 18. In embodiments, the bond coat 24 may include a MCrAlY alloy or an intermetallic aluminide, with such compositions and techniques for forming bond coats from those compositions generally known in the art. The TGO layer 26 is generally formed as a consequence of conditions that are generally employed to form the bond coat 24 and the TBC layer 18, and the TGO layer 26 may provide oxidation resistance to the bond coat 24 and may further provide a bonding surface for the TBC layer 18. For example, the TBC layer 18 may be formed at elevated temperatures on the order of 1000° C. in an oxygen-containing atmosphere, and the bond coat 24 may be heat treated prior to forming the TBC layer 18 over the bond coat 24, under which conditions the TGO layer 26 may form over the bond coat 24 prior to actual formation of the TBC layer 18.

Referring to FIGS. 2 and 3 and as alluded to above, the metal silicate protective layer 20 is formed over the TBC layer 18. The metal silicate protective layer 20 includes a metal silicate and the metal silicate protective layer 20 covers the columnar grains 28 and gaps 30 between the columnar grains 28 to impede intrusion of melted CMAS and other particulate melt into the gaps 30 and to further act as a diffusion barrier and impede reaction of the CMAS with the underlying TBC layer 18. In particular, the metal silicate protective layer 20 covers at least some of the gaps 30; deposition techniques to form the metal silicate protective layer 20 may aim to cover all gaps 30, although it is to be appreciated that some gaps 30 may remain exposed in accordance with variations in actual implementation.

The metal silicate protective layer 20 may be disposed directly upon the TBC layer 18 and may provide a substantially continuous barrier to effectively cover the gaps 30. By "substantially continuous", it is meant that the metal silicate protective layer 20 is formed under conditions that should result in a uniform, continuous layer over the immediately underlying layer, although non-uniformities may result in accordance with defects in actual implementation. It is to be appreciated that other layers (not shown) may be disposed between the metal silicate protective layer 20 and the TBC layer 18 provided that the metal silicate protective layer 20 still impedes intrusion of melted CMAS into the gaps 30. However, because many metal silicates have low mutual solubility with materials of the TBC layer 18 and exhibit low diffusion rates into the TBC layer 18, direct contact between the metal silicate protective layer 20 and the TBC layer 18 provides robust protection of the TBC layer 18. Further, the metal silicate protective layer 20 may have an exposed surface 32 that is free from additional layers overlying the exposed surface 32. In particular, the exposed surface 32 may be directly exposed to the atmosphere and prone to direct contact with CMAS that may be ingested by the turbine engine. FIG. 3A illustrates CMAS 34 disposed on the exposed surface 32 of the metal silicate protective layer 20.

The metal silicate protective layer 20 may be formed through techniques that enable the metal silicate protective layer 20 to cover the columnar grains 28 and the gaps 30 between the columnar grains 28 in the TBC layer. For example, the metal silicate protective layer 20 may be formed by sputtering a metal silicate over the TBC layer 18 to form the metal silicate protective layer 20 using, e.g., magnetron sputtering.

While various metal silicates may be suitable for the metal silicate protective layer 20, examples of specific suitable metals in the metal silicate protective layer 20 may be chosen from zirconium, hafnium, and combinations thereof. In particular, zirconium silicate and hafnium silicate are suitable materials for the metal silicate protective layer 20. Zirconium silicate, in particular, generally has sufficiently low mutual solubility with both silica and zirconia such that zirconium silicate generally remains chemically stable while in contact with both yttrium-stabilized zirconia and melted CMAS. The metal silicate protective layer 20 may include the metal silicate in an amount of at least about 98 weight % of the metal silicate, based on the total weight of the metal silicate protective layer 20. In an embodiment, the metal silicate protective layer 20 has a thickness of from about 1 to about 25 microns, which when considering the substantially continuous configuration of the metal silicate protective layer 20 over the TBC layer 18, is sufficiently thick to fill the gaps 30 between the columnar grains 28 in the TBC layer 18 to impede melted CMAS infiltration.

After forming the metal silicate protective layer 20, the metal silicate protective layer 20 generally has an amorphous form. To minimize change in structure in the turbine engine when exposed to elevated operating temperatures, the amorphous form of the metal silicate protective layer 20 may be converted into crystalline form through post-formation heat treatment of the metal silicate protective layer 20, thereby resulting in the metal silicate protective layer 20 being in crystalline form in the engine structure that is included in the turbine engine.

During operation of the turbine engine and as alluded to above, the turbine engine may ingest CMAS that is melted at elevated operating temperatures of the turbine engine. Referring to FIG. 3A, upon cooling, CMAS 34 deposits may form on the metal silicate protective layer 20, with the metal silicate protective layer 20 impeding intrusion of melted CMAS into the gaps 30 between the columnar grains 28 in the TBC layer 18. In this manner, the metal silicate protective layer 20 effectively inhibits thermo-mechanical degradation of the TBC layer 18 due to CMAS infiltration while maintaining the physical and mechanical properties of the TBC layer 18.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An engine structure comprising:
   a metal substrate;
   a thermal barrier coating layer overlying the metal substrate, wherein the thermal barrier coating layer has columnar grains with gaps defined therebetween; and
   a metal silicate protective layer formed over the thermal barrier coating layer, wherein the metal silicate protective layer covers the columnar grains and the gaps between the columnar grains, wherein the metal silicate protective layer comprises metal silicate in an amount of at least 98 wt. % based on the total weight of the metal silicate protective layer, wherein a metal in the metal silicate is chosen from zirconium, hafnium, and combinations thereof, and wherein the metal silicate protective layer is in crystalline form.

2. The engine structure of claim 1, wherein the thermal barrier coating layer is further defined as a zirconia-based layer comprising the columnar grains.

3. The engine structure of claim 2, wherein the zirconia-based layer comprises yttrium-stabilized zirconia.

4. The engine structure of claim 2, wherein a metal in the metal silicate protective layer is chosen from hafnium and a combination of hafnium and zirconium.

5. The engine structure of claim 2, wherein the metal silicate protective layer is disposed directly upon the zirconia-based layer.

6. The engine structure of claim 1, further comprising a bond coat disposed between the thermal barrier coating layer and the metal substrate.

7. The engine structure of claim 1, wherein the metal substrate comprises at least 50 weight % of one or more elemental metals, based on the total weight of the metal substrate.

8. The engine structure of claim 1, wherein the metal silicate protective layer has a thickness of from about 1 to about 25 microns.

9. The engine structure of claim 1, wherein the metal silicate protective layer has an exposed surface free from additional layers overlying the exposed surface.

10. The engine structure of claim 1, further defined as a rotating component of a turbine engine.

11. A method of forming an engine structure, the method comprising the steps of:

providing a metal substrate;

forming a thermal barrier coating layer overlying the metal substrate, wherein the thermal barrier coating layer comprises columnar grains with gaps defined therebetween;

forming a metal silicate protective layer over the thermal barrier coating layer, wherein the metal silicate protective layer covers the columnar grains and the gaps between the columnar grains in the thermal barrier coating layer, and wherein the metal silicate protective layer comprises metal silicate in an amount of at least 98 wt. % based on the total weight of the metal silicate protective layer, and wherein a metal in the metal silicate is chosen from zirconium, hafnium, and combinations thereof; and converting the metal silicate protective layer into crystalline form through post-formation heat treatment.

12. The method of claim 11, wherein forming the metal silicate protective layer comprises sputtering a metal silicate over the thermal barrier coating layer to form the metal silicate protective layer.

13. The method of claim 11, wherein forming the thermal barrier coating layer comprises forming zirconia-based thermal barrier coating layer over the metal substrate.

14. The method of claim 13, wherein forming the metal silicate protective layer comprises depositing a metal silicate chosen from hafnium and a combination of hafnium and zirconium.

15. The method of claim 11, wherein forming the thermal barrier coating layer comprises physical vapor depositing a thermal barrier coating material over the metal substrate to produce the columnar grains with the gaps defined therebetween in the thermal barrier coating layer.

16. The method of claim 11, wherein providing the metal substrate comprises forming the metal substrate into a shape of the engine structure for a turbine engine.

* * * * *